United States Patent
Klapper

(10) Patent No.: US 9,322,880 B2
(45) Date of Patent: Apr. 26, 2016

(54) MEASUREMENT OF A RESISTANCE OF A SWITCHING CONTACT OF AN ELECTRICAL CIRCUIT BREAKER

(71) Applicant: OMICRON Electronics GmbH, Klaus (AT)

(72) Inventor: Ulrich Klapper, Rankweil (AT)

(73) Assignee: OMICRON Electronics GmbH, Klaus (AT)

(*) Notice: Subject to any disclaimer, the term of this patent is extended or adjusted under 35 U.S.C. 154(b) by 432 days.

(21) Appl. No.: 13/868,138

(22) Filed: Apr. 23, 2013

(65) Prior Publication Data

US 2013/0300424 A1     Nov. 14, 2013

(30) Foreign Application Priority Data

May 10, 2012 (EP) ..................... 12003726

(51) Int. Cl.
    *G01R 31/327*     (2006.01)
    *G01R 27/20*     (2006.01)

(52) U.S. Cl.
    CPC ............ *G01R 31/3274* (2013.01); *G01R 27/20* (2013.01)

(58) Field of Classification Search
    CPC .... G01R 27/20; G01R 31/3274; G01R 31/32; G01R 31/333; H01H 1/0015
    USPC ................................. 324/415–424
    See application file for complete search history.

(56) References Cited

U.S. PATENT DOCUMENTS

| | | | |
|---|---|---|---|
| 4,104,578 A | 8/1978 | Thuot | |
| 5,677,476 A * | 10/1997 | McCarthy | G01K 1/026 324/611 |
| 6,198,285 B1 * | 3/2001 | Kormos | A61B 5/0017 324/318 |
| 6,492,819 B1 * | 12/2002 | Hilal | G01R 31/1227 324/537 |
| 6,815,955 B1 | 11/2004 | O'Neal, III | |
| 7,057,401 B2 * | 6/2006 | Blades | G01R 31/041 324/424 |
| 7,813,842 B2 * | 10/2010 | Iwamura | H04B 3/54 307/31 |

(Continued)

FOREIGN PATENT DOCUMENTS

| CN | 1645534 A | 7/2005 |
|---|---|---|
| CN | 1967147 A | 6/2007 |

(Continued)

OTHER PUBLICATIONS

Zoran Stanisic, Method for Static and Dynamic Resistance Measurements of HV Circuit Breaker, 2nd IEEE PES International Conference and Exhibition on in Innovative Smart Grid Technologies (2011).*

(Continued)

*Primary Examiner* — Arleen M Vazquez
*Assistant Examiner* — Robert P Alejnikov, Jr.
(74) *Attorney, Agent, or Firm* — Seyfarth Shaw LLP; Brian Michaelis

(57) ABSTRACT

The present invention relates to a measuring device (10) for measuring a resistance of a switching contact (5) of an electrical circuit breaker (1). The measuring device (10) comprises a high-current generating unit (11) for generating a measurement current for the resistance measurement, and a measuring unit (12) for registering a measurement signal at the circuit breaker (1) during the opening or closing of the switching contact (5), and for determining a time-based resistance course of the switching contact (5) during opening or closing, in dependence on the measurement current and the measurement signal.

12 Claims, 1 Drawing Sheet

(56) References Cited

U.S. PATENT DOCUMENTS

2011/0084715 A1* 4/2011 Stanisic ............ G01R 31/3274 324/713
2013/0300423 A1* 11/2013 Klapper ............ G01R 31/3272 324/424

FOREIGN PATENT DOCUMENTS

| CN | 1976147 A | 6/2007 |
|---|---|---|
| CN | 201141894 Y | 10/2008 |
| CN | 201281748 Y | 7/2009 |
| CN | 101672890 A | 3/2010 |
| CN | 201569703 U | 9/2010 |
| CN | 102033195 A | 4/2011 |
| CN | 102033195 A1 | 4/2011 |
| CN | 102288907 A | 12/2011 |

OTHER PUBLICATIONS

Zoran Stanisic: "Method for static and dynamic resistance measurements of HV circuit breaker", Innovative Smart Grid Technologies (ISGT Europe), 2011, 2nd IEEE PES International Conference and Exhibition On, IEEE, Dec. 5, 2011, pp. 1-5.

Chinese Search Report for CN2013101646257.

* cited by examiner

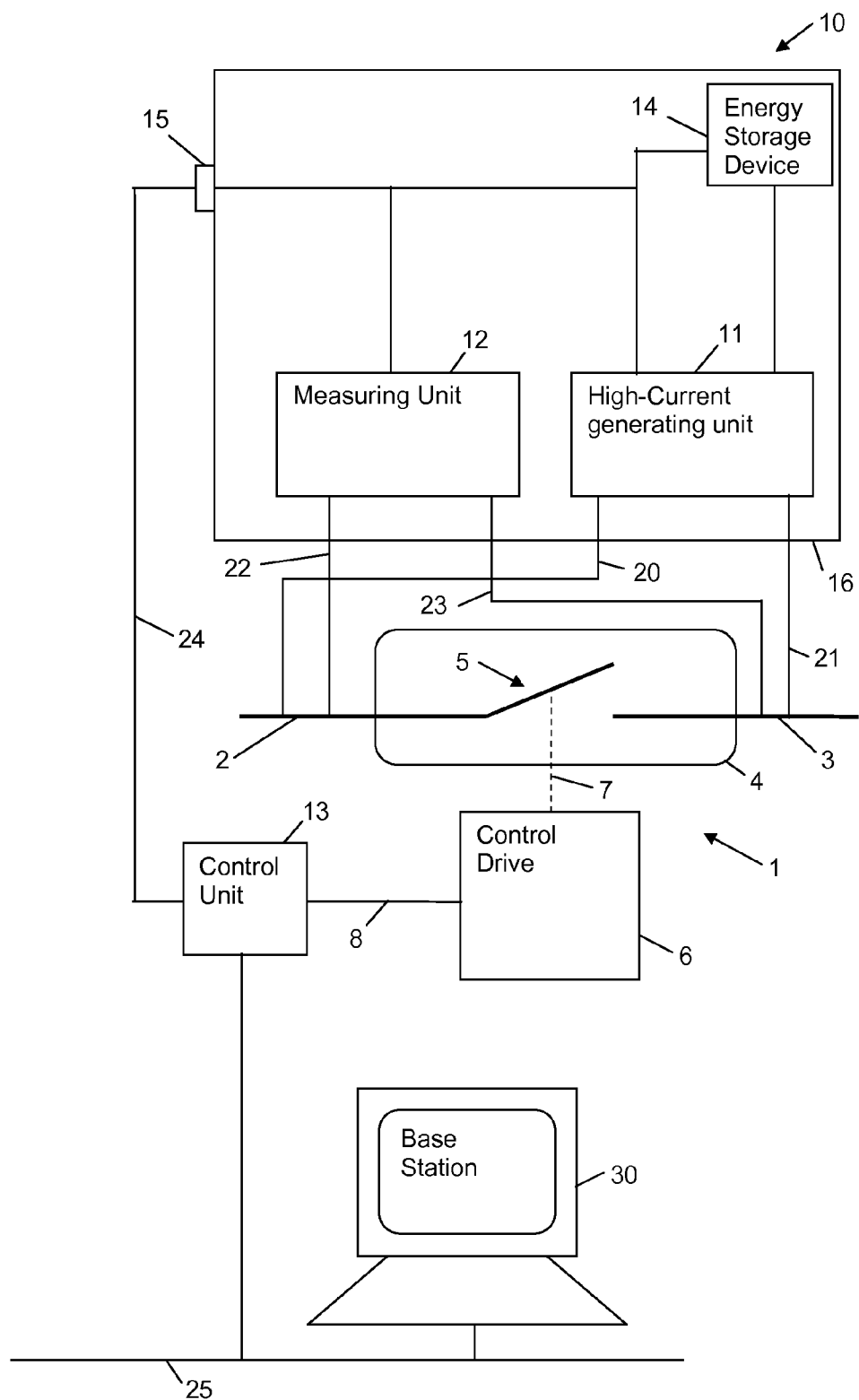

MEASUREMENT OF A RESISTANCE OF A SWITCHING CONTACT OF AN ELECTRICAL CIRCUIT BREAKER

RELATED CASE INFORMATION

The present invention claims priority to EP Application No. 12003726.2, filed May 10, 2012 which is incorporated herein in its entirety.

FIELD OF THE INVENTION

The present invention relates to a measuring device and to a method for measuring a resistance of a switching contact of an electrical circuit breaker or of an electrical high-voltage switch.

BACKGROUND OF THE INVENTION

Circuit breakers, which are also referred to as high-voltage switches, are used in energy engineering to make or break electrical connections under load. The nominal voltages of the circuit breakers can be in the range from a few volts up to some hundred kilovolts. The switched load currents can be several tens of kiloamperes in the case of a short-circuit. For reliable operation of the circuit breaker, therefore, for example in connection with service inspections, the contact resistance of a switching contact of the electrical circuit breaker is checked. A high degree of wear can occur at the switching contact of the circuit breaker, for example burn-off of the arcing contacts, during switching under load and, in particular, during breaking of a short-circuit current.

SUMMARY OF THE INVENTION

It is therefore the object of the present disclosure to determine a state, in particular a state of wear of the switching contact of an electrical circuit breaker, and to check the mechanical state of the drive and of the contacts.

This object is achieved, according to the present disclosure, by a measuring device for measuring a resistance of a switching contact of an electrical circuit breaker, according to the disclosure a method for measuring a resistance of a switching contact of an electrical circuit breaker is disclosed.

Provided according to the present disclosure is a measuring device for measuring a resistance of a switching contact of an electrical circuit breaker. The measuring device comprises a high-current generating unit and a measuring unit. The high-current generating unit serves to generate a measurement current for the resistance measurement, and can be coupled to the circuit breaker for the purpose of feeding the measurement current into the circuit breaker. The measuring unit can be coupled to the circuit breaker, and is designed to register a measurement signal at the circuit breaker.

The measurement signal can comprise, for example, a voltage across the switching contact of the circuit breaker. The measuring device is able to register the measurement signal during the opening or during the closing of the switching contact, and to determine a time-based resistance course of the switching contact during the opening or closing operation, in dependence on the measurement current and the measurement signal. The determination of the time-based resistance course of the switching contact makes it possible to determine, not only the contact resistance of the switching contact in the closed state, but also a time-based behaviour of the resistance of the switching contact while contacts of the switching contact are being brought into contact during closing of the circuit breaker or are being separated from each other during opening of the circuit breaker. A state of wear of the switching contact, for example, can be determined on the basis of the time-based resistance course.

According to the disclosure, the measuring device comprises a housing in the form of a portable unit. At least the high-current generating unit and the measuring unit are accommodated in the housing. As a result, the measuring device can be disposed in immediate proximity to the circuit breaker, such that power losses of the high-current generating unit over long in-feed cables can be minimized and, in addition, measurement signals can be registered without interference, or with little interference, since the measurement signals, likewise, do not have to be transmitted over long in-feed lines. The measuring device can be realized, in particular, in such a way that the housing is disposed, for example, on the housing of the switching contact, such as, for example, a ceramic housing, of the switching contact, such that in-feed lines to the connections of the circuit breaker can be very short, for example having a length of 1 to 2 m for a high-voltage switch, and considerably shorter than 1 m for a medium-voltage switch. Preferably, there are no operator control elements on the measuring device.

According to one illustrative embodiment, the measuring unit is designed to determine the resistance course of the switching contact, as a sequence of digital resistance values, in dependence on the measurement current and the measurement signal. The sequence of digital resistance values can be output via an energy supply connection, which serves to supply the measuring device with electrical energy. The energy supply connection can be, for example, a so-called Power over Ethernet connection or so-called Power Line Communication connection. Alternatively, the energy supply connection can comprise a plurality of plug connectors, and the energy supply cable to be connected to the energy supply connection can comprises a plurality of differing electrical conductors, which are held together mechanically and used, on the one hand, to transmit the sequence of digital resistance values and, on the other hand, to transmit the energy for supplying the measuring device.

The differing electrical conductors can be held together, for example, by means of cable binders or by means of a common cable sheath. In the case of the Power over Ethernet connection or the Power Line Communication connection, on the other hand, the electrical energy for supplying the measuring device is transmitted, like the sequence of digital resistance values, over common conductors. The sequence of digital resistance values can be transmitted, for example, to a ground station that comprises, for example, an electronic control system or a computer, and that is suitable for storing and evaluating the sequence of digital resistance values. For the purpose of measuring a resistance of a switching contact of, for example, a circuit breaker on a high-voltage line, the measuring device can therefore be disposed in immediate proximity to the circuit breaker, at a height of, for example, 6 m, at which the circuit breaker is located, and can be coupled to the circuit breaker via correspondingly short connections. The transmission of the time-based resistance course, for example as a sequence of digital resistance values, to the ground station can be effected via a correspondingly longer cable, such that the measurement values from the measuring device can be registered with a high degree of accuracy and can be transmitted digitally to the ground station without interference or faults.

According to a further illustrative embodiment, the measuring device comprises a capacitive energy storage device, for example a capacitor, which is coupled to the high-current generating unit. The high-current generating unit is able to generate a measurement current from both electrical energy from the capacitive energy storage device and from electrical energy from the energy supply connection of the measuring device, for a defined period, in particular for a defined measurement period. The thus generated measurement current has an electrical power that is greater than the power consumed by the measuring device, via the energy supply connection, during the period. The capacitive energy storage device thus serves to buffer electrical energy, in order to keep a current consumption or energy consumption of the measuring device low during the resistance measurement and, at the same time, to enable a measurement current having a substantially greater power to be provided for the resistance measurement. The high-current generating unit can generate, for example, a measurement current of some 10 amperes, for example a measurement current of at least 100 amperes.

According to a further illustrative embodiment, the measuring device additionally comprises a control unit, in a separate housing. The control unit is designed to activate the circuit breaker to open or close the switching contact.

According to yet a further illustrative embodiment, the control unit is able to output digital control signals, via a computer network, for opening or closing the switching contact. The digital control signals can comprise, for example, signals according to the standard IEC 61850. Circuit breakers that are capable of opening or closing their switching contacts on the basis of commands according to the standard IEC 61850, so-called goose messages, can consequently be activated by the measuring device to determine or record a time-based resistance course of the switching contact during opening or closing. As a result, the measuring operation can be performed in an automated manner.

Additionally provided according to the disclosure is a method for measuring a resistance of a switching contact of an electrical circuit breaker. In the case of the method, a measuring current is generated for the resistance measurement, and the measurement current is fed into the circuit breaker. The circuit breaker is activated to open or close the switching contact, and during the opening or closing of the switching contact a measurement signal is registered at the circuit breaker. A time-based resistance course of the switching contact during opening or closing is determined in dependence on the measurement current and the measurement signal. The method can be performed with the measuring device described above. The measuring device can be disposed, in particular, in immediate proximity to the circuit breaker. In other words, for example in the case of a high-voltage switch, the measuring device is disposed approximately at the same height at which the switching contacts are located. As a result, the lines for feeding the measurement current into the circuit breaker and for registering the measurement signal can be made correspondingly short, such that there is the least possible injection of interference from adjacent measurements being conducted at the same time, or other electrical interference, for example from switching devices or energy plants. As a result, the state and functional capability of the circuit breaker can be determined reliably and with a high degree of accuracy, in particular after a first installation or servicing or service inspection.

BRIEF DESCRIPTION OF THE DRAWINGS

In the following, the invention will be described by means of illustrative embodiments with reference to the drawings.

FIG. 1 shows a schematic circuit diagram of measuring device according to an illustrative embodiment of the present invention, which measuring device is coupled to a circuit breaker and to a ground station.

DETAILED DESCRIPTION OF THE INVENTION

The present invention is explained in the following, with reference to the drawing, on the basis of illustrative embodiments. FIG. 1 depicts schematically, a measuring device according to an illustrative embodiment of the present invention, wherein measuring device according to the disclosure is coupled to a circuit breaker and to a ground station.

FIG. 1 shows a circuit breaker 1, which is coupled to lines 2 and 3, in order either to electrically couple the lines 2 and 3 to each other or to break an existing electrical connection between the lines 2 and 3. The circuit breaker 1 comprises a housing 4, in which there is disposed a switching contact 5 that performs the actual switching operation. The circuit breaker 1 additionally comprises a control drive 6, which actuates the switching contact 5 via a mechanical coupling 7. The control drive 6 can comprise, for example, a so-called spring storage drive, which comprises springs, as energy storage devices, for providing the mechanical energy for opening and closing the switching contact 5. The control drive 6 can in addition comprise an electrical drive, for example an electric motor, which loads the springs. Furthermore, the control drive 6 can comprise trip coils that, as a result of being electrically activated, release the mechanical energy, stored in the coils, for opening or closing the switching contact 5. For the purpose of supplying the control drive 6 with electrical energy, the control drive 6 can have a corresponding current connection. Control of the trip coils can be effected, for example, via the connection 8 shown in the FIGURE. Alternatively, commands for opening or closing the switching contact 5 can also be transmitted to the control drive 6 via a bus system, for example according to the standard IEC 61850.

Additionally shown in the FIG. 1 is a control unit 13, which can issue commands to the control drive 6, via the line 8, for opening and closing the switching contact (5).

Further shown in FIG. 1 is a measuring device 10, which is designed to measure a resistance of the switching contact 5 of the electrical circuit breaker 1. The measuring device 10 comprises a high-current generating unit 11, a measuring unit 12 and a housing 16. The high-current generating unit 11 can generate a measurement current of several 100 amperes, for example 200 amperes, which is fed into the circuit breaker 1 via lines 20, 21. The measuring unit 12 is coupled to the circuit breaker 1 via lines 22 and 23, and is able to register a measurement signal, for example a voltage drop that occurs at the circuit breaker 1, in particular across the switching contact 5, because of the measurement current from the high-current generating unit 11. The measuring device 10 additionally comprises an energy supply connection 15, which can be coupled to, for example, an energy supply system, via a line 24. Via the energy supply connection 15, the measuring device 10 can be supplied, for example, with a usual network voltage of 230 volts.

From the energy provided via the energy supply connection 15, the high-current generating unit 11 generates the measurement current for the resistance measurement. For the purpose of briefly generating a measurement current that has a greater power than can be provided via the energy supply connection 15, the measuring device 10 can comprise a capacitive energy storage device 14, which is charged with energy by the energy supply system, before the resistance measurement, and which provides additional energy for the high-current generating unit 11 during the resistance measurement.

The control unit 13 is coupled to the high-current generating unit 11 and to the measuring unit 12 and, via the connection 8, to the control drive 6 of the circuit breaker 1. Via the connection 8, the control unit 13 can activate the circuit breaker 1 to open or close the switching contact 5. During the opening or closing of the switching contact 5, the measuring unit 12 registers a measurement signal and, in dependence on the measurement current generated by the high-current generating unit 11 and the measurement signal, determines a time-based resistance course of the switching contact 5 during opening or closing. In order to achieve a high degree of measurement accuracy of the time-based resistance course, the measuring device 10 is disposed in immediate proximity to the circuit breaker 1. In the case of a circuit breaker for a high-voltage line, the switching contact 5 is generally disposed at a height of several meters above the ground, for example at a height of 6 m. Accordingly, the measuring device 10 is disposed at approximately the same height as the circuit breaker 1, and in immediate proximity thereto.

For example, the measuring device can be fastened to the housing 4 of the circuit breaker 1 or to the high-voltages lines 2 or 3. As a result, only very short connections 20-23 are required, such that interference from other measurements on other circuit breakers, or other electromechanical interference, have only a small effect on the measurement signal registered by the measuring unit 12. Moreover, owing to the short connection lengths, only low energy losses occur in the connections 20, 21 because of the measurement current from the high-current generating unit 11.

The measuring device 10 can convert the registered measurement signal, or the time-based resistance course determined therefrom, into a digital form, and can transmit this to a ground station or base station 30, for example a measuring station or a PC. The digitized information can be transmitted, for example, to the control unit 13, via a line that is integral with the connection 24, and from the control unit 13 can be transmitted further, for example via a network 25, to the ground station 30. For this purpose, the connection 24 can comprise, for example, a plurality of electrical conductors that serve, on the one hand, to transmit electrical energy to the measuring device and, on the other hand, serve to transmit the digitized information from the measuring device to the control unit 13. Alternatively, the connection 24 can also comprise a so-called Power over Ethernet or so-called Power Line Communication connection, in which both energy and digitized information are transmitted via common conductors.

Through the measurement of the time-based resistance course of the switching contact 5 during opening or closing, the state of the switching contact 5 can be checked and evaluated on the basis of the course of the resistance over time or over the switching distance, for example after installation of the circuit breaker or after a service inspection of the circuit breaker 1. Since the measuring device 10 is disposed in immediate proximity to the circuit breaker 1, the measuring accuracy can be increased and less energy is required for measurement of the resistance. Since the determined time-based resistance course is transmitted to the ground station 30 via the connection 24, the cabling of the measuring arrangement can be simplified.

The measuring device 10 can comprises further components, which are not shown in the FIGURE. Furthermore, the control drive 6 can comprise an energy supply unit that, for example, provides energy for the electric motor of the control drive 6, for the purpose of loading the springs, and that generates control voltages for activating the trip coils of the control drive 6.

Although the devices, systems, and methods have been described and illustrated in connection with certain embodiments, many variations and modifications will be evident to those skilled in the art and may be made without departing from the spirit and scope of the disclosure. The discourse is thus not to be limited to the precise details of methodology or construction set forth above as such variations and modification are intended to be included within the scope of the disclosure.

The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A measuring device for measuring a resistance of a switching contact of an electrical circuit breaker, comprising:
    a high-current generating unit that generates a measurement current for a resistance measurement, the high-current generating unit being coupled to the electrical circuit breaker, the high-current generating unit feeding the measurement current into the electrical circuit breaker,
    a measuring unit coupled to the circuit breaker, the measuring unit configured to detect a measurement signal at the electrical circuit breaker during opening and closing of the switching contact, the measuring unit further configured to determine a time-based resistance course of the switching contact during opening and closing, the resistance course being determined as a sequence of digital resistance values, the measuring unit comprising a housing, the housing being a unit mountable on the switching contact, the housing being configured to accommodate the high-current generating unit and the measuring unit, and
    an energy supply connection configured to supply the measuring device with electrical energy, the measuring unit being configured to output the sequence of digital resistance values via the energy supply connection.

2. The measuring device according to claim 1, further comprising a control unit in a separate housing, the control unit being configured to activate the electrical circuit breaker to open and close the switching contact.

3. The measuring device according to claim 2, wherein the control unit is configured to output control signals, via a network, for opening and closing the switching contact.

4. The measuring device according to claim 1, wherein the supplying of the measuring device with electrical energy and the transmission of the sequence of digital resistance values from the measuring device are effected via a single electrical conductor.

5. The measuring device according to claim 4, wherein the energy supply connection comprises one of a Power over Ethernet connection or a Power Line communication connection.

6. The measuring device according to claim 1, further comprising a capacitive energy storage device coupled to the high-current generating unit, the high-current generating unit being configured to generate a measurement current for a defined period, the measurement current being driven by electrical energy from the capacitive energy storage device and electrical energy from an energy supply connection of the measuring device, the measurement current being driven with a greater electrical power than is consumed by the measuring device, via the energy supply connection, during the defined period.

7. The measuring device according to claim 1, wherein the high-current generating unit is configured to generate a measurement current of at least 10 A.

8. The measuring device according to claim 1, wherein the measurement signal comprises a voltage across the switching contact of the electrical circuit breaker.

9. A method for measuring a resistance of a switching contact of an electrical circuit breaker using a measuring device comprising a housing mountable on the switching contact, the housing including at least a high-current generating unit and a measuring unit, comprising:

generating, using the high-current generating unit, a measurement current for a resistance measurement, feeding the measurement current into the electrical circuit breaker, activating the electrical circuit breaker to open and close the switching contact, detecting, using the measurement unit, a measurement signal at the electrical circuit breaker during the opening and closing of the switching contact, determining a time-based resistance course of the switching contact during opening and closing, the time-based resistance course being dependent on the measurement current and the measurement signal, the time-based resistance course further being determined as a sequence of digital resistance values, and outputting, using the measuring unit, the sequence of digital resistance values via an energy supply connection.

10. The method according to claim 9, wherein the method is performed with the measuring device according to claim 1.

11. The method according to claim 10, wherein the measuring device is disposed in immediate proximity to the electrical circuit breaker.

12. The method according to claim 10, wherein the measuring device is disposed in immediate proximity to a housing of the switching contact.

* * * * *